United States Patent [19]

Thornburg

[11] 4,099,071
[45] Jul. 4, 1978

[54] MONOLITHIC ELECTRONIC SCANNING DEVICE

[75] Inventor: David D. Thornburg, Los Altos, Calif.

[73] Assignee: Xerox Corporation, Stamford, Conn.

[21] Appl. No.: 747,123

[22] Filed: Dec. 3, 1976

[51] Int. Cl.² .............. H03K 17/00; H01C 3/08; H03K 19/32; G01R 21/02
[52] U.S. Cl. .................. 307/239; 307/216; 307/310; 307/350; 324/106; 328/96; 357/28; 338/217
[58] Field of Search ............... 307/116, 117, 208, 216, 307/298, 310, 231, 350, 132 T; 324/99 D, 106; 328/3, 75, 93, 97, 96; 338/138, 142, 217; 357/28; 358/213, 241

[56] References Cited

U.S. PATENT DOCUMENTS

| | | | |
|---|---|---|---|
| 2,978,664 | 4/1961 | Walters | 338/217 |
| 3,496,377 | 2/1970 | Rice | 307/117 X |
| 3,546,491 | 12/1970 | Berglund | 307/310 X |
| 3,573,438 | 4/1971 | Rowen | 307/310 X |
| 3,629,776 | 12/1971 | Watano | 338/142 X |
| 3,987,311 | 10/1976 | Thornburg | 357/28 X |
| 4,006,414 | 2/1977 | Parker | 324/106 |
| 4,009,482 | 2/1977 | Nakata | 357/28 |

*Primary Examiner*—Larry N. Anagnos
*Attorney, Agent, or Firm*—James J. Ralabate; Sheldon F. Raizes; Leonard Zalman

[57] ABSTRACT

A tapered resistor heating element is provided which sequentially heats and actuates in a controlled fashion heat sensitive media. In one embodiment a tapered resistor heating element sequentially heats in a controlled fashion heat sensitive switches. Heat sensitive resistors and heat sensitive threshold switches may also be employed in this configuration. This system may be utilized as a meter relay or as described in another embodiment as a scanner. Novel exclusive OR gates are also disclosed which are employed in one embodiment of the scanner of the instant invention.

1 Claim, 3 Drawing Figures

MONOLITHIC ELECTRONIC SCANNING DEVICE

BACKGROUND OF THE INVENTION

This invention relates generally to scanning devices and more specifically to monolithic electronic scanning devices.

It is known that a major problem with matrix addressed displays and the like is the requirement for numerous connections in their implementation between the matrix elements and the ancillary addressing and driving devices. For instance, a display panel with $10^6$ matrix elements requires about $2 \times 10^3$ connections in order to be properly implemented. For devices which are raster scanned, the number of external connections can be greatly reduced provided that the scanning electronics are located on the matrix device panel itself. Such devices, however, are not well known in the art since simple, economical and radically new technologies have not been developed which would effectively allow the production of such devices.

Now with the advent of tapered resistor technology more specifically defined in U.S. Ser. No. 747,167, entitled Tapered Resistor Device and filed concurrently herewith which is hereby respectfully incorporated by reference, such novel devices are possible with novel applications of such technology. In the instant recited application, a device is described comprising a tapered resistor element which develops a non-uniform temperature profile on electrical energization which is interacted after being energized with selected heat sensitive media to provide a number of very useful effects and devices which may be employed in a great many applications with ease, simplicity and greater economy than heretofore possible including the scanning apparatus of the instant invention.

Generally described therein a conventional resistive device is seen to be a resistive film having a uniform thickness which has been formed into a resistor of a specified width and length. This film is then placed on an insulating substrate which is bonded to a heat sink. When an electrical current I is passed through the resistor the production of Joule heat causes a steady state temperature above ambient $\Delta T$ which, if thermal fringing effects are neglected, may be theoretically defined by the relationship $$\Delta T = \frac{d_s I^2 \rho_s}{K_s W^2} \quad \text{(Eq. 1)}$$

in which $d_s$ and $K_s$ are respectively the thickness and thermal conductivity of the substrate and $\rho_s$ is the sheet resistivity of the resistive material measured in ohms/square. (Note: $\rho_2 = \rho/d$ where $\rho$ is the bulk resistivity of the resistive material.) It is readily seen from this illustration that since the width of the resistor is uniform the local power dissipation and hence the temperature rise is also uniform so that no temperature gradient is established and the unique and utilizable effect of the device of the instant invention is not realized.

However, as is seen in FIG. 2 of U.S. Ser. No. 747,167, a device may be provided including a resistive film which significantly has a varying width in the horizontal plane while the thickness remains uniform. This film may be placed on an insulating substrate 2 which in turn is bonded to a heat sink 3. Now it is seen that the width of the resistive element 1 is a monotonically increasing function of position along the length of the element or, in simple terms, the resistive element is tapered. In the event the slope of the taper is gradual over distances comparable with the substrate thickness, equation 1 recited above will still be applicable for a first approximation. When a tapered resistor is energized the local power generation will vary along the length of the resistor so that points of prescribed temperature rise can be made to move along the tapered resistor by varying the current flowing through the device.

Although the non-uniformity of the width of the resistive film 1 may vary in any suitable fashion, it is assumed for purposes of this discussion that the taper is linear as is seen in FIG. 1 so that the following relationship is theoretically true:

$$w = w_o + bx \quad \phi < x < 1 \quad \text{(Equation 2)}$$

in which $w_0$ is the width at the narrow end of the taper, B is the slope of the taper and $x$ is the distance along the resistor measured from the narrow end. Assuming that the tapered resistive element is in contact with, for example, a thermographic substance which undergoes a color change when heated to the temperature T' or above, as the current is increased in the tapered resistor a color line of $x'$ will be drawn. The length of this line may theoretically be derived as follows: the temperature differential T' is defined as $\Delta T' = T' - T'_{amb}$ where $T'_{amb}$ is the ambient temperature. combining equations 1 and 2 yields the relationship between the applied current and the distance $x'$ over which the tapered resistor will be heated to temperature T' or above, i.e., $$x' = \frac{I \left( \frac{d_s \rho_s}{K_s \Delta T'} \right)^{\frac{1}{2}} - w_o}{b} \quad \text{(Equation 3)}$$

It is seen that when $w_0$ is greater than zero no region of the taper will be hotter than T' for currents given by $$I < \frac{w_o}{\left( \frac{d_s \rho_s}{K_s \Delta T'} \right)^{\frac{1}{2}}} \quad \text{(Equation 4)}$$

It is the purpose of the instant invention to employ this new technology in providing a novel scanning device.

It is therefore an object of this invention to provide a novel scanning device devoid of the above-noted deficiencies.

Still another object of this invention is to provide a scanning device employing a tapered resistor element.

Yet another object of this invention is to provide a simple, economical and useful scanning system both in manufacture and application.

Yet again another object of this invention is to provide a highly reliable scanner system.

These and other objects are accomplished generally speaking in accordance with the general principles of the instant invention by providing a tapered resistor heating element which sequentially heats and actuates in a controlled fashion heat sensitive elements. In one embodiment of the instant invention a tapered resistor heating element sequentially heats in a controlled fashion heat sensitive switches. A tapered resistance element is biased by suitable current source in orer to achieve a steady state temperature distribution consisting of a gradient in temperature along the resistor. More specifically, it is to be found that narrower regions will be heated more than wider regions an the temperature profile will vary monotonically from one end of the resistor to the other. In close proximity to this resistor is placed a plurality of heat sensitive switches which are, for example, formed on the top of a thin insulating layer deposited on the tapered resistor element.

Initially the voltage across the tapered resistor is zero and all switches are in their off state. The voltage across the tapered resistor may be increased in a ramp-like fashion which will result in the time dependent increase in temperature in the vicinity of each of the switching devices, with the devices near the narrow end being heated to the threshold temperature $T_0$ before devices at wider regions of the taper. As the devices are so heated the switching devices will sequentially turn on. The rate at which the switch is sequentially turned on increases with increasing ramp rate with an upper limit being determined by the thermal transport properties of the device substrate. Thus it is seen that a scanning circuit is provided which may have as its input current from any one of a number of sources which is to be measured thereby activating the heat sensitive media which may be used as an output in order to, for example, either indicate a current value or further energize part of the system in which the device is incorporated. This could be used to provide an electrical switch closure which indicates when the current through the TRE has reached or exceeded a certain value. By examining the state of several switches along the TRD, an indication could be made of whether the current through the TRE was below, within or over a specified range. This would be useful in automatic load compensation circuits for power supplies, for example. In this mode the TRD of the instant invention functions as a "meter relay" which, unlike conventional meter relays, can have a large number of "trip points" (i.e., current levels at which a switch will close).

While the above-recited application has been described in terms of a heat activated switch, it should be noted that other heat sensitive media such as thermally triggered threshold switches and heat sensitive resistors may also be employed as described above in order to provide further embodiments of the scanning device of the instant invention.

A heat sensitive resistor differs from a heat triggered switch in that the heat sensitive resistor undergoes a smooth and continuous change in resistance with temperature change, whereas the heat sensitive switch undergoes an abrupt resistance change when heated to the threshold temperature $T_0$.

A heat sensitive threshold switch differs from a heat triggered switch in that the heat sensitive threshold switch goes from high resistance state to a low resistance state on being subjected to a threshold voltage. The threshold voltage can vary strongly with device temperature. This differs from heat sensitive switches in that heat sensitive switches can undergo switch closure in the absence of any impressed voltage.

Although it can be seen as recited above that the scanning circuit recited may have considerable utility in a number of applications, it is in addition desired in some scanning applications that only one switch or heat sensitive device in a sequence be turned on at a time. For example, this is especially true in the operation and implementation of matrix addressed systems. Therefore, in another embodiment of the instant invention employing any of the above-recited heat sensitive media, an exclusive "OR" gate is connected to each of the switching devices, the outputs of the gate being in the low or off state except for any gate which is receiving both an off and an on input simultaneously. This condition can only occur at one location on the taper at which the leading edge of the heat gradient resides which will provide both the on and off inputs simultaneously and result in a matrix address system.

The general principle of the instant invention having been recited above, the specifics of the instant invention will be more clearly understood with reference to the drawings of which:

Figure 1:
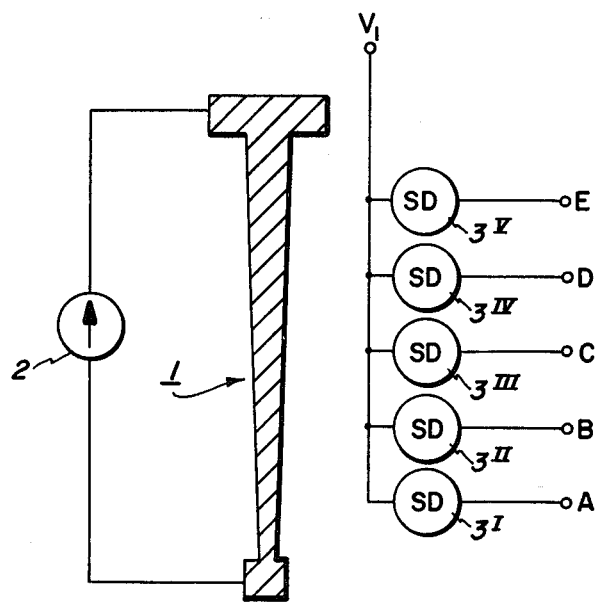
FIG. 1 illustrates a tapered resistor element employed in connection with a plurality of switching devices.

In FIG. 1 is seen a tapered resistor element 1 which is biased by a suitable current source 2 to achieve a steady state temperature distribution consisting of a gradient in temperature along the resistor. As hereinbefore indicated, the narrower regions of the resistor will be heated more than the wider regions and the temperature profile will vary monotonically from one end of the resistor to the other. A plurality of switching devices $3_{I-V}$ are placed in close and operative proximity to the tapered resistor element 1. These switches 3 have the property that below threshold temperature $T_0$ they are in the off or insulating state and above this temperature the resistors are in the on or conducting state. At time = zero the voltage impressed across the tapered resistor is zero and all the switches are in their off state. A voltage is applied across the resistor 1 in a ramp-like fashion increasing the temperature in the vicinity of each of the switching devices 3 where the device is near the narrow end being heated to the threshold temperature $T_0$ before devices at the wider regions of the taper. In this manner the switching devices are made to sequentially turn on.

Figure 2:
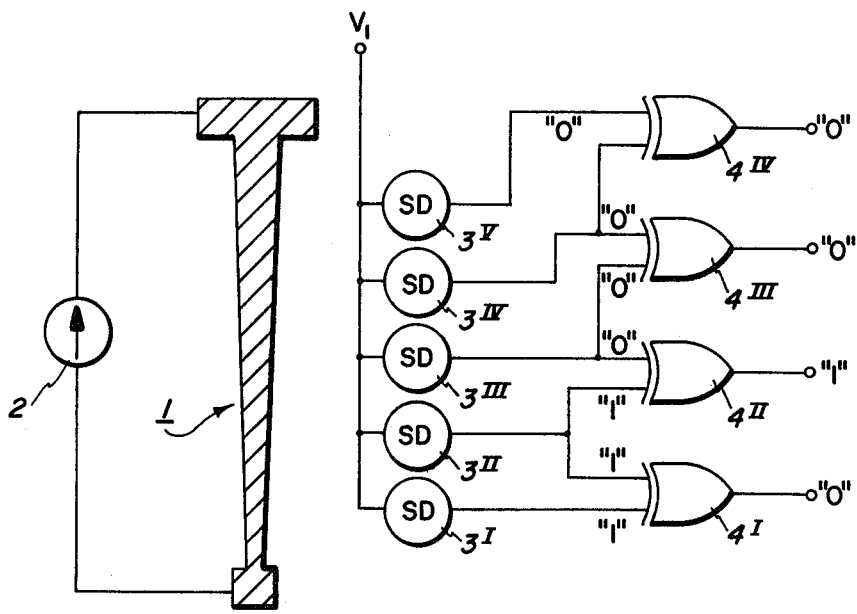
FIG. 2 illustrates the scanning system of the instant invention with addressing capability.

In FIG. 2 is seen the apparatus of FIG. 1 further including appropriate connections to exclusive "OR" gates $4_{I-IV}$. Thus there is provided a method and means to specifically address one of the switches when at one particular exclusive "OR" gate the signal received is not either both on or both off but either one being on and the other being off in response to the position of the leading edge of the heated taper 1. In connecting the exclusive "OR" gates $4_{I-IV}$ as shown in FIG. 2, the outputs of these gates will all be in the low or off state except for any gate which is receiving both an on and off input simultaneously as described formerly. As previously indicated, this can only occur at one location on the taper and this leads to the addressing location desired depending on the input applied.

Figure 3:
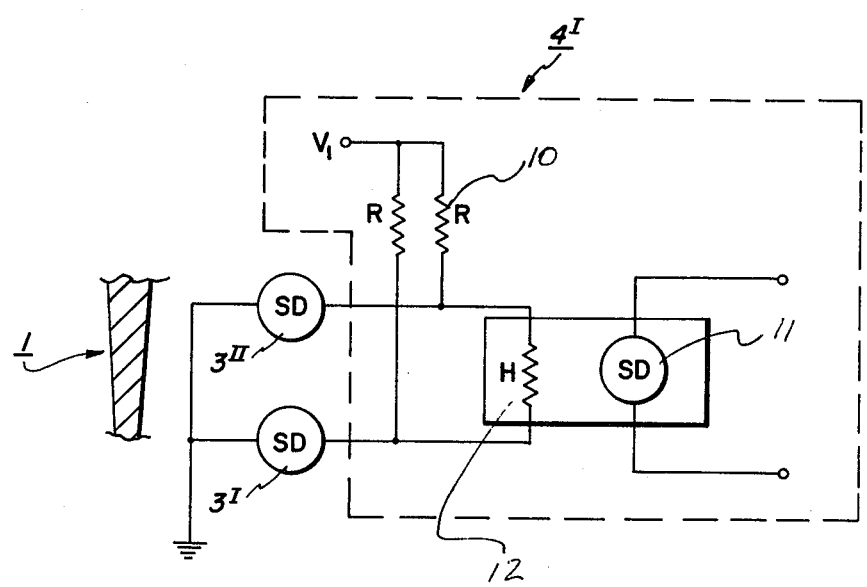
FIG. 3 represents another embodiment of the instant invention with addressing capability.

In FIG. 3 is seen another embodiment of the instant invention providing for an addressing application which may be fabricated from the same thin film material as used in the device shown in FIG. 1. This device is comprised of two pull-up resistors 10 and a thermally triggered switch 11 with a heater 12. When the switching devices $3_{I-II}$ are both off there is no voltage drop across the heater 12 and the output switching device is off. The same is true where both devices $3_{I-II}$ are both on. However, if one or the other but not both of the devices $3_{I-II}$ are on current will flow through the heater 12 and turn the output switching device 11 on.

Any suitable material may comprise the heat sensitive switch of the instant invention. Typical materials include certain transition metal oxides which undergo an abrupt transition from a generally high resistance to a generally low resistance state on being heated past a critical transition temperature. $VO_2$ is a preferred example of such a material.

Any suitable material may comprise the heat sensitive resistor of the instant invention. Typical materials include certain semiconductors which undergo pronounced continuous changes in resistance when heated. Examples of preferred materials are amorphous (a-) $CdAs_2$, numerous chalcogenide glasses, and many crystalline semiconductors such as germanium and silicon.

Any suitable material may comprise the threshold switching device of the instant invention. Typical materials include certain chalcogenide glasses such as a-$As_{30}Te_{48}Si_{12}Ge_{10}$.

To further define the specifics of the present invention, the following illustrative examples are intended to illustrate and not limit the particulars of the present system. Parts and percentages are by weight unless otherwise indicated.

EXAMPLE 1. A "meter relay" is fabricated on a borosilicate glass substrate by first depositing a film of a resistive metal of nichrome (80% Ni, 20% Cr) to a desired sheet resistivity of 20 ohms/square. Conventional photolithographic processing is employed to define a linearly tapered resistor which tapers from 20 to 60 mils over a length of 2 inches and which is provided with terminals to allow connection to an external power source. The tapered resistor is then covered, except for the terminals, with a thin insulating film of thermally cured polyimide photoresist HTPR-514 available from the GAF Corporation. This film is about 1 μm thick and thus provides excellent electrical insulation over the tapered resistor while allowing excellent thermal conductivity to any layer deposited over the polyimide film. Furthermore, polyimide films of the type mentioned above are dimensionally and chemically stable to temperatures in excess of 250° C. Next the polyimide film is covered with a thin layer of $VO_2$, which is about 1 μm thick and which is then defined by conventional photolithographic and etching methods into a linear array of small rectangles positioned at equal spacings along the length of the tapered resistor. The $VO_2$ rectangles are about 20 mils wide and 10 mils long, so that a rectangle located near the narrow end of the tapered resistor will just cover the tapered resistor at that point. The spacing between successive rectangles is about 0.2 inch, so that 10 such rectangles are located along the length of the tapered resistor. The $VO_2$ rectangles are then provided with electrodes made from vapor deposited aluminum which have been defined by photolithography into a series of coplanar gap electrodes positioned over each $VO_2$ rectangle and extending away from the tapered resistor so that electrical connections can be easily made between the $VO_2$ devices and ancillary electronic devices. The electrode gap over the $VO_2$ film is chosen to be a few μm. The $VO_2$ devices thus fabricated are heated above 69° C and are found to undergo a more than four order of magnitude decrease in resistance. On cooling below 69° C, the switch reverts to its high resistance state.

The terminals of at least one of the $VO_2$ switches are connected to various circuits which become activated in some designed manner when the $VO_2$ switch attains a low resistance state. In one application, three of the switches are connected to circuitry which turns on an incandescent lamp when the $VO_2$ switch is closed. When the tapered resistor is now connected to an external source of electrical signals, none of the $VO_2$ switches will be closed if the signal current is sufficiently low so as to keep any of the $VO_2$ devices from reaching 69° C. If the signal increases, however, one or some of the switches turn on. Those switches which have been connected to external circuitry will then activate that circuitry if they have been heated to 69° C or greater. As the signal is increased, more of the switches turn on; and as the signal is decreased, some or all of the switches are turned off. In this manner a time varying external analog signal is used to sequentially turn on or turn off a series of switches.

EXAMPLE 2. A "meter relay" using the present invention is fabricated on a borosilicate glass substrate by first depositing a film of a resistive metal such as nichrome (80% Ni, 20% Cr) to a desired sheet resistivity of 20 ohms/square. Conventional photolithographic processing is then used to define a linearly tapered resistor which tapers from 20 to 60 mils over a length of 2 inches and which is provided with terminals to allow connection to an external power source. The tapered resistor is then covered, except for the terminals, with a thin insulating film of thermally cured polyimide photoresist HTPR-514 available from the GAF Corporation. This film is on the order of 1 μm thick and thus provides excellent electrical insulation over the tapered resistor while allowing excellent thermal conductivity to any layer deposited over the polyimide film. Furthermore, polyimide films of the type mentioned above are dimensionally and chemically stable to temperatures in excess of 250° C. Next the polyimide film is covered with a thin layer of a-$CdAs_2$, which is on the order of 1 μm thick and which is then defined by conventional photolithographic and etching methods into a linear array of small rectangles positioned at equal spacings along the length of the tapered resistor. The a-$CdAs_2$ rectangles are 20 mils wide and 10 mils long, so that a rectangle located near the narrow end of the tapered resistor will just cover the tapered resistor at that point. The spacing between successive rectangles is 0.2 inch, so that 10 such rectangles would be located along the length of the tapered resistor. The a-$CdAs_2$ rectangles are then provided with electrodes made from vapor deposited aluminum which are define by photolithography into a series of coplanar gap electrodes positioned over each a-$CdAs_2$ rectangle and extending away from the tapered resistor so that electrical connections can be easily made between the a-$CdAs_2$ devices and ancillary electronic devices. The electrode gap over the a-$CdAs_2$ film is chosen to be a few μm. The a-$CdAs_2$ devices thus fabricated undergo a continuous and smooth decrease in electrical resistance when the material is heated. a-$CdAs_2$ is known to be a semiconductor with a thermally activated conductivity which has an activation energy on the order of 0.35 eV. The terminals of at least one, but more likely several of the a-$CdAs_2$ resistors are connected to various circuits which will become activated in some designed manner when the a-$CdAs_2$ resistor attains a specified lower resistance state.

EXAMPLE 3. A "meter relay" is fabricated on a borosilicate glass substrate by first depositing a film of a resistive metal such as nichrome (80% Ni, 20% Cr) to a sheet resistivity of 20 ohms/square. Conventional photolithographic processing is then used to define a linearly tapered resistor which tapers from 20 to 60 mils over a length of 2 inches and which is provided with terminals to allow connection to an external power source. The tapered resistor is then covered, except for the terminals, with a thin insulating film of thermally cured polyimide photoresist HTPR-514 available from the GAF Corporation. This film can be on the order of 1 µm thick and thus provides excellent electrical insulation over the tapered resistor while allowing excellent thermal conductivity to any layer deposited over the polyimide film. Furthermore, polyimide films of the type mentioned above are dimensionally and chemically stable to temperatures in excess of 250° C. The polyimide film is covered with a thin layer of a-$As_{30}Te_{48}Si_{12}Ge_{10}$, which is on the order of 1 µm thick and which is then defined by conventional photolithographic and etching methods into a linear array of small rectangles positioned at equal spacings along the length of the tapered resistor. The a-$As_{30}Te_{48}Si_{12}Ge_{10}$ rectangles are 20 mils wide and 10 mils long, so that a rectangle located near the narrow end of the tapered resistor will just cover the tapered resistor at that point. The spacing between successive rectangles is 0.2 inch, so that 10 such rectangles would be located along the length of the tapered resistor. The a-$As_{30}Te_{48}Si_{12}Ge_{10}$ rectangles are then provided with electrodes made from vapor deposited aluminum which are defined by photolithography into a series of coplanar gap electrodes positioned over each a-$As_{30}Te_{48}Si_{12}Ge_{10}$ rectangle and extending away from the tapered resistor so that electrical connections can be easily made between the a-$As_{30}Te_{48}Si_{12}Ge_{10}$ devices and ancillary electronic devices. The electrode gap over the a-$As_{30}Te_{48}Si_{12}Ge_{10}$ film is chosen to be a few µm. The a-$As_{30}Te_{48}Si_{12}Ge_{10}$ devices thus fabricated behave as thermally activated threshold switches which abruptly switch from a high to a low resistance state under a suitable applied bias when heated to a specified temperature. The device is heated to a temperature wherein the transition from a high to low resistance state takes place when the device is biased beyond the threshold voltage. Since the threshold voltage decreases with increasing temperature for these devices, the application of a voltage which is sub-threshold at one temperature will cause switching of the device when the device is heated to a second, higher, temperature. The switching device remains in the switched on state until the applied voltage to the device is dropped below the critical holding level.

The terminals of at least one of the a-$As_{30}Te_{48}Si_{12}Ge_{10}$ threshold switches are connected to various circuits which become activated in a designed manner when the a-$As_{30}Te_{48}Si_{12}Ge_{10}$ threshold switch attains a low resistance state. Three of the switches are connected to circuitry which turns on an incandescent lamp when the a-$As_{30}Te_{48}Si_{12}Ge_{10}$ threshold switch is closed. When the tapered resistor is connected to an external source of electrical signals, none of the a-$As_{30}Te_{48}Si_{12}Ge_{10}$ threshold switches will be closed if the signal current is sufficiently low as to keep any of the a-$As_{30}Te_{48}Si_{12}Ge_{10}$ threshold devices from reaching the temperature at which the applied threshold switch bias is sufficient to trigger the device into the on state. If the signal to the tapered resistor increases, however, one or some of the threshold switches may turn on. Those threshold switches which are connected to external circuitry activate that circuitry when they are heated to the appropriate temperature. As the signal is increased, more of the switches turn on; but as the signal is decreased, none of the switches are turned off unless the threshold switch bias is reduce below the holding level. In this manner a time varying external analog signal is used to sequentially turn on a series of switches and provide electronic memory of the largest signal which is applied to the tapered resistor.

EXAMPLE 4. An "electronic scanner" is fabricated on a borosilicate glass substrate by first depositing a film of a resistive metal such as nichrome (80% Ni, 20% Cr) to a sheet resistivity of 20 ohms/square. Conventional photolithographic processing is then used to define a linearly tapered resistor which tapers from 20 to 60 mils over a length of 2 inches and which is provided with terminals to allow connection to an external power source. Pull up resistors and a heater resistor for ancillary exclusive-OR gates shown in FIG. 3 are also fabricated at this stage. The tapered resistor and the heater resistor are then covered, except for the terminals, with a thin insulating film of thermally cured polyimide photoresist HTPR-514 available from the GAF Corporation. This film is on the order of 1 µm thick and thus provides excellent electrical insulation over the tapered resistor while allowing excellent thermal conductivity to any layer deposited over the polyimide film. Furthermore, polyimide films of the type mentioned above are dimensionally and chemically stable to temperatures in excess of 250° C. Next the polyimide film is covered with a thin layer of $VO_2$, which is on the order of 1 µm thick and which is then defined by conventional photolithographic and etching methods into a linear array of small rectangles positioned at equal spacings along the length of the tapered resistor as well as into small rectangles positioned over the insulated heater resistors. The $VO_2$ rectangles are 20 mils wide and 10 mils long, so that a rectangle located near the narrow end of the tapered resistor just covers the tapered resistor at that point. The spacing between successive rectangles along the tapered resistor is 0.2 inch so that 10 such rectangles are located along the length of the tapered resistor. All $VO_2$ rectangles are then provided with electrodes made from vapor deposited aluminum which are defined by photolithography into a series of coplanar gap electrodes positioned over each $VO_2$ rectangle and interconnected in the manner illustrated in FIGS. 2 and 3 so as to make the electronic scanner of the instant invention. The electrode gap over the $VO_2$ film is chosen to be a few µm. The $VO_2$ devices thus fabricated are heated and are seen to behave as thermally activated switches which undergo an abrupt decrease in electrical resistance when the material is heated above 69° C. A more than four order of magnitude decrease in resistance is observed when the device is heated above 69° C. On cooling below 69° C, the switch reverts to its high resistance state.

The terminals of at least one but more likely several of the $VO_2$ switches are connected from the exclusive-OR gates to various circuits which will become activated in a designed manner when the $VO_2$ switch attains a low resistance state. These switches are connected to circuitry which drives one axis of a flat panel display. When the tapered resistor is connected to an external electrical ramp signal, none of the $VO_2$ switches will be closed if the ramp current is sufficiently low as to keep any of the $VO_2$ devices from reaching 60° C. When the signal is increased, however, one or some of the switches over the tapered resistor turn on. The switch which is turned on and which is adjacent to one which is turned off will provide appropriate bias to the heater resistor connected to these two devices, thus triggering the switch which is in proximity to the heater resistor (i.e., the exclusive-OR gate). Since only one of the exclusive-OR gates will be on at a time, the desired properties of an electronic scanner are thus obtained.

Although the present examples were specific in terms of conditions and materials used, any of the above listed typical materials may be substituted when suitable in the above examples with similar results. In addition to the steps used to carry out the process of the present invention, other steps or modifications may be used if desirable. In addition, other materials may be incorporated in the system of the present invention which will enhance, synergize, or otherwise desirably affect the properties of the systems for their present use.

Anyone skilled in the art will have other modifications occur to him based on the teachings of the present invention. These modifications are intended to be encompassed within the scope of this invention.

What is claimed is:

1. An electronic indicating apparatus comprising:
   a tapered resistor device comprised of an electrically insulating substrate and an electrical resistive element supported by said substrate, said resistive element having a tapered configuration whereby its cross-sectional area varies steadily along its length,
   a plurality of heat sensitive devices adjacently positioned along the length of said resistive element, each of said heat sensitive devices having one resistance value and one output signal voltage level when at one temperature and a different resistive value and a different output signal voltage level when at a different temperature,
   a plurality of multi-input terminal electronic gating devices, each of said gating devices having a pair of its input terminals connected to receive the output signals of a different adjacent pair of said plurality of heat sensitive devices, and
   means for passing a current through said resistive element, whereby the voltage levels of the output signals of an adjacent pair of said heat sensitive devices are different and the output voltage of the gating device coupled to that adjacent pair of said heat sensitive devices changes value to reflect said voltage level difference.

* * * * *